(12) United States Patent
Sauciuc et al.

(10) Patent No.: US 7,539,016 B2
(45) Date of Patent: May 26, 2009

(54) ELECTROMAGNETICALLY-ACTUATED MICROPUMP FOR LIQUID METAL ALLOY ENCLOSED IN CAVITY WITH FLEXIBLE SIDEWALLS

(75) Inventors: Ioan Sauciuc, Phoenix, AZ (US); Ravi Mahajan, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 462 days.

(21) Appl. No.: 11/322,495

(22) Filed: Dec. 30, 2005

(65) Prior Publication Data

US 2007/0164427 A1    Jul. 19, 2007

(51) Int. Cl.
  *H05K 7/20*  (2006.01)
  *F04B 43/14*  (2006.01)

(52) U.S. Cl. ............... 361/699; 361/688; 361/689; 257/714; 417/322; 417/412; 417/413.1; 417/474

(58) Field of Classification Search ............... 361/718, 361/699, 688, 689; 257/714; 417/322, 412, 417/413.1, 474
See application file for complete search history.

(56) References Cited

U.S. PATENT DOCUMENTS

| | | | | |
|---|---|---|---|---|
| 2,930,324 A | * | 3/1960 | Toulmin, Jr. | 417/413.1 |
| 3,606,592 A | * | 9/1971 | Madurski et al. | 417/413.1 |
| 3,733,616 A | * | 5/1973 | Willis, Jr. | 623/3.11 |
| 3,768,931 A | * | 10/1973 | Willis, Jr. | 417/322 |
| 4,432,699 A | * | 2/1984 | Beckman et al. | 417/63 |
| 4,449,893 A | * | 5/1984 | Beckman et al. | 417/322 |
| 4,468,177 A | * | 8/1984 | Strimling | 417/413.1 |
| 4,498,850 A | * | 2/1985 | Perlov et al. | 417/322 |
| 4,697,989 A | * | 10/1987 | Perlov et al. | 417/53 |
| 4,869,656 A | * | 9/1989 | Della Sala | 417/412 |
| 4,886,429 A | * | 12/1989 | Osada et al. | 417/413.1 |
| 5,002,471 A | * | 3/1991 | Perlov | 417/413.1 |
| 5,011,380 A | * | 4/1991 | Kovacs | 417/413.1 |
| 5,286,176 A | * | 2/1994 | Bonin | 417/413.1 |
| 6,109,888 A | * | 8/2000 | Marshall | 417/413.1 |
| 6,579,223 B2 | * | 6/2003 | Palmer | 600/16 |
| 6,658,861 B1 | * | 12/2003 | Ghoshal et al. | 62/3.7 |
| 7,104,313 B2 | * | 9/2006 | Pokharna et al. | 165/80.4 |
| 7,131,286 B2 | * | 11/2006 | Ghoshal et al. | 62/259.2 |
| 7,340,904 B2 | * | 3/2008 | Sauciuc et al. | 62/3.2 |
| 7,348,665 B2 | * | 3/2008 | Sauciuc et al. | 257/714 |
| 2004/0182088 A1 | * | 9/2004 | Ghoshal et al. | 62/3.7 |
| 2006/0045755 A1 | * | 3/2006 | McDonald et al. | 417/50 |

FOREIGN PATENT DOCUMENTS

SU    954609    *    9/1982

* cited by examiner

*Primary Examiner*—Anatoly Vortman
(74) *Attorney, Agent, or Firm*—George Chen

(57) ABSTRACT

The present invention discloses a method of confining a liquid metal alloy within a closed-loop system; distributing a first portion of the liquid metal alloy in a cavity within the closed-loop system; turning on an electromagnet to generate a magnetic field to permeate flexible sidewalls of the cavity; attracting the liquid metal alloy in the cavity towards the electromagnet to expand the flexible sidewalls; inducing a second portion of the liquid metal alloy to enter the cavity from an inlet end of a pipe within the closed-loop system; turning off the electromagnet; repelling the liquid metal alloy in the cavity away from the electromagnet to contract the flexible sidewalls; and inducing a third portion of the liquid metal alloy to exit the cavity to an outlet end of the pipe.

6 Claims, 1 Drawing Sheet

ELECTROMAGNETICALLY-ACTUATED MICROPUMP FOR LIQUID METAL ALLOY ENCLOSED IN CAVITY WITH FLEXIBLE SIDEWALLS

BACKGROUND OF THE INVENTION

1. Field of the Invention

The present invention relates to the field of semiconductor integrated circuit (IC) manufacturing, and more specifically, to an apparatus for and a method of transferring heat from a heat source, such as a chip with a hot spot, to a remote heat rejection system.

2. Discussion of Related Art

In 1965, Gordon Moore first observed that the maximum number of devices per unit area on a chip could be doubled every 18 months. Over the four decades since the so-called Moore's Law was first set forth, the semiconductor industry, which has since expanded globally, has validated it by developing many new designs and processes. In particular, continual enhancements in lithography have permitted a reduction in a minimum critical dimension (CD) that may be successfully patterned for a feature on the devices on the chip. Furthermore, on-going improvements in doping, deposition, and etch have also allowed greater precision and accuracy in establishing the desired dopant profiles, film thicknesses, and feature depths across the chip.

Unfortunately, increasing device density inevitably results in elevated power consumption by the chip. Thus, the chip may have to be cooled during operation to avoid the possibility of catastrophic damage due to any excessive overheating. In less demanding situations, passive cooling of the chip may be quite sufficient. However, in more demanding situations, active cooling of the chip may become mandatory.

Although various techniques to cool the chip have become widespread, the methods tend to be more suitable for cooling large areas around the chip rather than for cooling small areas, such as hot spots, within the chip.

Thus, a need exists for an apparatus for and a method of transferring heat from a heat source, such as a chip with a hot spot, to a remote heat rejection system.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention discloses an apparatus for and a method of transferring heat from a heat source, such as a chip with a hot spot, to a remote heat rejection system.

Figure 1:
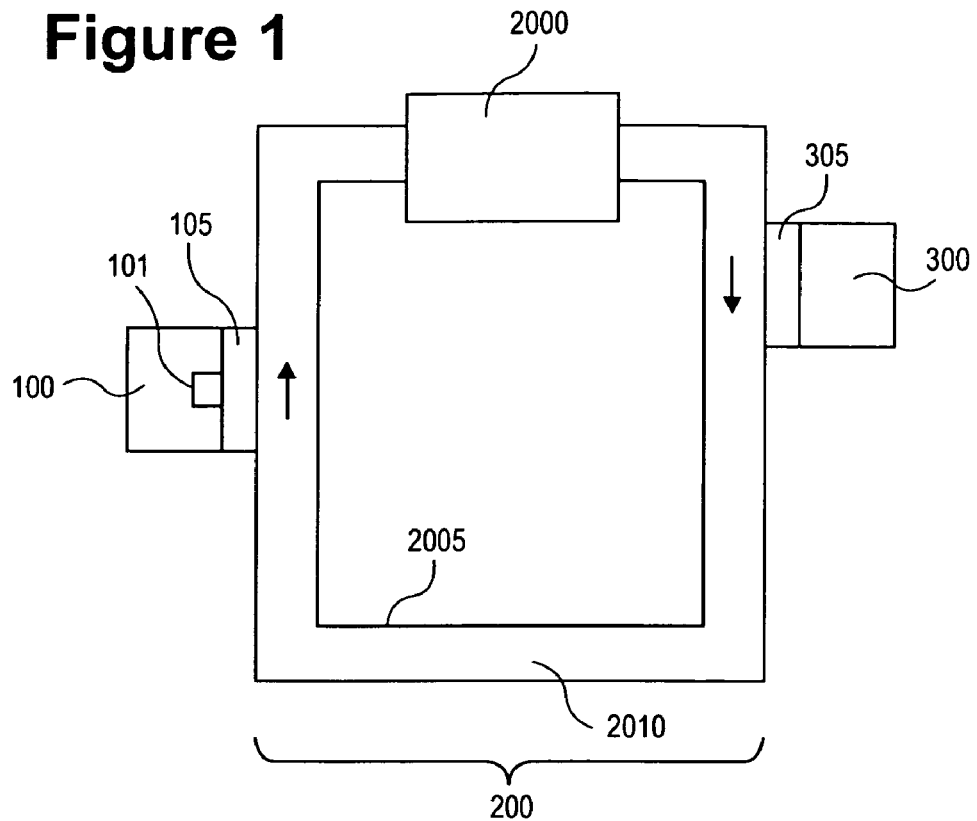
FIG. 1 is an illustration of a heat transfer system according to an embodiment of the present invention.

As shown in an embodiment of the present invention in FIG. 1, an electrical component, such as an enclosure, board, package, or chip 100, may dissipate excessive heat to create a hot spot 101. The chip 100 may include a microprocessor. The hot spot 101 may include a localized region of the chip, package, board, or enclosure that may has an elevated temperature relative to room temperature. In an embodiment of the present invention, the hot spot 101 may be located towards, or at, a surface of the chip 100.

Heat emanating or diffusing from the hot spot 101 of the chip 100 may be transferred across a first thermal interface material (TIM1) 105 to a working fluid confined within a pipe 2005. In an embodiment of the resent invention, the heat transfer may be passive with conduction as a primary mechanism. In an embodiment of the resent invention, the heat transfer may be active with forced convection (not shown) as a primary mechanism.

As shown in an embodiment of the present invention in FIG. 1, the portion of the pipe 2005 that contacts the TIM1 105 may be located at an outer surface of the chip 100. In an embodiment of the present invention, the portion of the pipe 2005 that contacts the TIM1 105 may be located in a recessed region (not shown) adjacent to the outer surface of the chip 100. In an embodiment of the present invention, the portion of the pipe 2005 that contacts the TIM1 105 may be located in an embedded region (not shown) of the chip 100.

As shown in an embodiment of the present invention in FIG. 1, the portion of the pipe 2005 that contacts the TIM1 105 may include surface channels having various dimensions, cross-sections, and shapes. In an embodiment of the present invention, the portion of the pipe 2005 that contacts the TIM1 105 may include sub-surface channels (not shown) having various dimensions, cross-sections, and shapes.

As shown in an embodiment of the present invention in FIG. 1, the pipe 2005 may be part of a heat transfer system 200. In an embodiment of the present invention, the walls of the heat transfer system 200 may include thermally insulated portions except for thermally conductive portions that are in contact with TIM1 105 and TIM2 305. In an embodiment of the present invention, the outer surfaces of the heat transfer system 200 may include thermally insulated portions except for thermally conductive portions that are in contact with TIM1 105 and TIM2 305. The thermally insulated portions may include a ceramic material, such as fused silica or quartz. The thermally conductive portions may include a metallic material, such as aluminum or copper.

In an embodiment of the present invention, the walls of the heat transfer system 200 may be formed from a material that will not interact chemically or physically with the working fluid at an operating temperature and pressure. In an embodiment of the present invention, the inner surfaces of the heat transfer system 200 may be coated with a material that will not interact chemically or physically with the working fluid at an operating temperature and pressure.

The heat transfer system 200 may include a closed-loop system that contains a fixed quantity of the working fluid. In an embodiment of the present invention, the working fluid may include one or more ferromagnetic materials. Ferromagnetic materials include iron (Fe), cobalt (Co), and nickel (Ni) from Group VIII B of the periodic table. Gadolinium (Gd) is also a ferromagnetic material.

In an embodiment of the present invention, the working fluid may include one or more paramagnetic materials. Paramagnetic materials include lithium (Li) from group I A, magnesium (Mg) from group II A, tantalum (Ta) from group V B, molybdenum (Mo) from group VI B, platinum (Pt) from group VIII B, and aluminum (Al) from group III A.

In an embodiment of the present invention, the liquid metal alloy 2010 may include one or more ferromagnetic or paramagnetic materials. The ferromagnetic or paramagnetic materials may be in a solid phase that is irreversibly dispersed within the working fluid, such as in a slurry.

In an embodiment of the present invention, the working fluid may include a liquid metal alloy 2010. The liquid metal alloy 2010 has a high thermal conductivity and a high electrical conductivity. In an embodiment of the present invention, the liquid metal alloy 2010 may be ferromagnetic. In an embodiment of the present invention, the liquid metal alloy 2010 may be paramagnetic.

A high thermal conductivity may improve a transfer of heat. In an embodiment of the present invention, the liquid metal alloy 2010 may have a thermal conductivity of 8-45 Watt/(meter-degree Kelvin) (W/(m-K)). In an embodiment of the present invention, the liquid metal alloy 2010 may have a thermal conductivity of 30-85 W/(m-K). In an embodiment of the present invention, the liquid metal alloy 2010 may have a thermal conductivity of 75-120 W/(m-K).

A low thermal resistance may improve a transfer of heat. In an embodiment of the present invention, the liquid metal alloy 2010 may have a thermal resistance of 0.007-0.0015 (degree Centigrade-square centimeters)/Watt (($C-cm^2$)/W). In an embodiment of the present invention, the liquid metal alloy 2010 may have a thermal resistance of 0.015-0.0030 ($C-cm^2$)/W. In an embodiment of the present invention, the liquid metal alloy 2010 may have a thermal resistance of 0.030-0.0060 ($C-cm^2$)/W. In an embodiment of the present invention, the liquid metal alloy 2010 may have a thermal resistance of 0.060-0.0120 ($C-cm^2$)/W.

The liquid metal alloy 2010 may have a thermal conductivity that is 15-200 times higher than for water so any temperature increase may occur faster and more uniformly than for water.

The liquid metal alloy 2010 may have a specific heat that is 10-35 times lower than for water so any temperature increase may be larger than for water, thus requiring a larger quantity of working fluid to be recirculated or a faster rate of recirculation or flow.

The liquid metal alloy 2010 may have a density that is 6-11 times higher than for water, thus requiring a larger amount of energy to be expended for recirculation or flow.

In an embodiment of the present invention, the working fluid may include a single phase, such as a gas or a liquid. The gas may be compressible while the liquid may be incompressible. In an embodiment of the present invention, the working fluid may include two phases, such as a gas-liquid mixture. In an embodiment of the present invention, the gas-liquid mixture may be homogeneous and include two phases of the same material at or near a boiling point. In an embodiment of the present invention, the gas-liquid mixture may be heterogeneous and include two different materials.

In an embodiment of the present invention, the working fluid may include a vapor pressure significantly lower than that for water. In an embodiment of the present invention, the working fluid may include a boiling point significantly higher than that for water.

The liquid metal alloy 2010 may transition from a solid phase to a liquid phase at a melting point or liquidus. In an embodiment of the present invention, the liquid metal alloy 2010 may have a liquidus of 6-26 degrees Centigrade compared with water which has a liquidus of 0 C. In an embodiment of the present invention, the liquid metal alloy 2010 may have a liquidus of 26-46 C. In an embodiment of the present invention, the liquid metal alloy 2010 may have a liquidus of 46-66 C. In an embodiment of the present invention, the liquid metal alloy 2010 may have a liquidus of 66-86 C.

In an embodiment of the present invention, the working fluid may include a liquid metal alloy 2010 at an operating temperature. In an embodiment of the present invention, the liquid metal alloy 2010 may include one or more metals, such as gallium (Ga) and indium (In) from Group III A of the periodic table.

Gallium is not considered to be toxic. Gallium may wet a surface. Gallium may improve thermal conductivity across an interface, such as TIM1 105 and TIM2 305. Gallium may reduce susceptibility to oxidation. Gallium may lower liquidus of an alloy.

Indium is not considered to be toxic, but indium-containing compounds may be toxic, teratogenic, and carcinogenic. Indium may wet both metallic and non-metallic surfaces. Indium may improve stability in air and water.

In an embodiment of the present invention, the liquid metal alloy 2010 may include one or more metals, such as tin (Sn) and lead (Pb) from Group IV A of the periodic table.

Lead is considered to be toxic and may have an adverse impact on the environment.

In an embodiment of the present invention, the liquid metal alloy 2010 may include one or more metals, such as bismuth (Bi) from Group V A of the periodic table.

Bismuth is not considered to be toxic and may have a low cost. Bismuth has the lowest thermal conductivity of any metal, except for mercury (Hg). Bismuth does not wet very well. Bismuth may lower liquidus of an alloy. A liquid metal alloy that includes bismuth may have a liquidus of 47-271 C. Bismuth is diamagnetic. Copper (Cu), silver (Ag), and gold (Au) from group I B of the periodic table are also diamagnetic.

In an embodiment of the present invention, the liquid metal alloy 2010 may include one or more metals, such as zinc (Zn) and cadmium (Cd) from Group II B of the periodic table.

Cadmium is considered to be toxic and may have an adverse impact on the environment. Cadmium wets very well.

In an embodiment of the present invention, the liquid metal alloy 2010 may include 60-99% by weight of gallium. In an embodiment of the present invention, the liquid metal alloy 2010 may include 30-60% by weight of bismuth. In an embodiment of the present invention, the liquid metal alloy 2010 may include 5-65% by weight of indium. In an embodiment of the present invention, the liquid metal alloy 2010 may include 5-20% by weight of tin.

In an embodiment of the present invention, the liquid metal alloy 2010 may be an ordinary alloy of $Ga^{95}In^5$ with a liquidus of 25.0 C. In an embodiment of the present invention, the liquid metal alloy 2010 may be an eutectic alloy of $Ga^{75.5}In^{24.5}$ with a liquidus of 15.7 C.

In an embodiment of the present invention, the liquid metal alloy 2010 may include $Ga^{68}In^{20}Sn^{12}$ with a liquidus of 10.5 C. In an embodiment of the present invention, the liquid metal alloy 2010 may be an eutectic alloy of $Ga^{62.5}In^{21.5}Sn^{16}$ with a liquidus of 10.7 C.

In an embodiment of the present invention, the liquid metal alloy 2010 may be an ordinary alloy of $Ga^{61}In^{25}Sn^{13}Zn^1$ with a liquidus of 7.6 C.

In an embodiment of the present invention, the liquid metal alloy 2010 may include $Bi^{33.7}In^{66.3}$ with a liquidus of 72 C.

In an embodiment of the present invention, the liquid metal alloy 2010 may include $Bi^{57}In^{26}Sn^{17}$ with a liquidus of 79 C. In an embodiment of the present invention, the liquid metal alloy 2010 may include $Bi^{54.02}In^{29.68}Sn^{16.3}$ with a liquidus of 81 C. In an embodiment of the present invention, the liquid metal alloy 2010 may include $Bi^{32.5}In^{51}Sn^{16.5}$ with a liquidus of 60 C.

In an embodiment of the present invention, the liquid metal alloy 2010 may include $Bi^{49}In^{21}Sn^{12}Pb^{18}$ with a liquidus of 58 C. In an embodiment of the present invention, the liquid metal alloy 2010 may include $Bi^{49}In^{18}Sn^5Pb^{18}$ with a liquidus of 69 C.

In an embodiment of the present invention, the working fluid may include one or more alkali metals, such as sodium (Na) and potassium (K) from Group I A of the periodic table. In an embodiment of the present invention, the working fluid may include $Na^{22}K^{78}$ with a liquidus of −11 C.

The heat transfer system 200 may include a closed-loop system that contains a fixed quantity of the working fluid. After transfer of heat from the chip 100 across the TIM1 105 to the working fluid, the heat transfer system 200 may include a micropump 2000 to recirculate the working fluid as shown in an embodiment of the present invention in FIG. 1.

Figure 2:
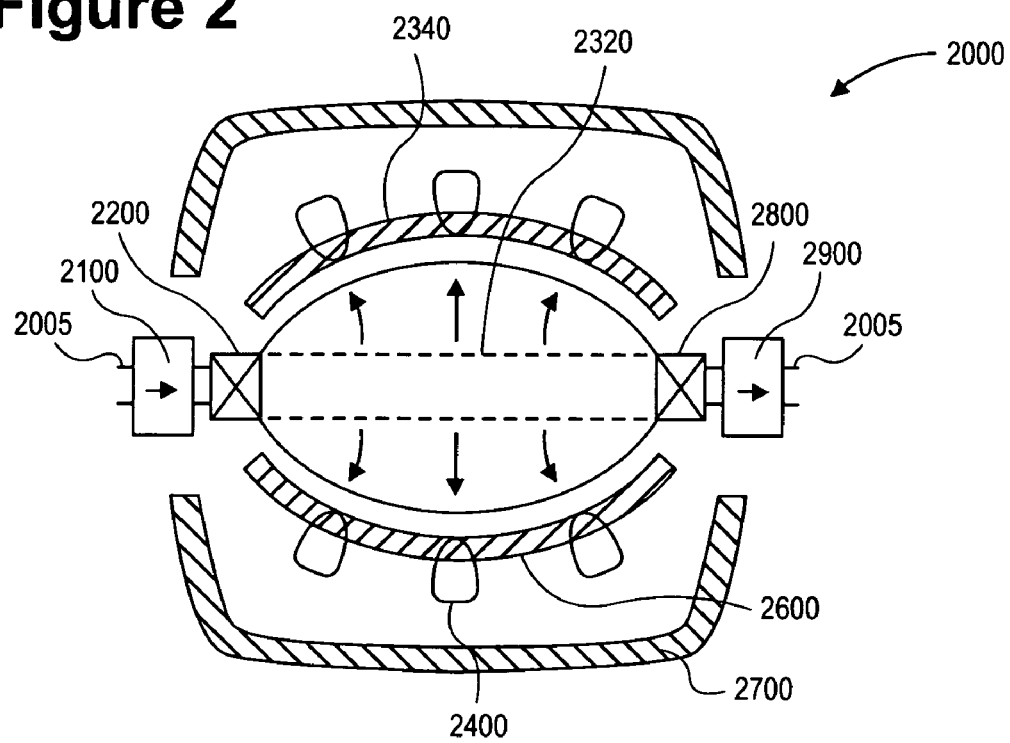
FIG. 2 is an illustration of a micropump according to an embodiment of the present invention.

As shown in an embodiment of the present invention in FIG. 2, an inlet end of the pipe 2005 may be connected to the inlet end of the micropump 2000 by an inlet coupler 2100. An outlet end of the pipe 2005 may be connected to the outlet end of the micropump 2000 by an outlet coupler 2900.

In an embodiment of the present invention, an inlet check valve 2200 and an outlet check valve 2800 may be included in the heat transfer system 200 to control or modify directional flow of the working fluid. The inlet check valve 2200 and the outlet check valve 2800 may either open upon activation or close upon activation, depending upon the design. In an embodiment of the present invention, the activation may be either linear or non-linear in response to differential applied pressure.

In an embodiment of the present invention, the inlet check valve 2200 and the outlet check valve 2800 may be unidirectional to prevent backflow of the working fluid during operation of the micropump 2000. As shown in an embodiment of the present invention in FIG. 1, the working fluid will flow in the pipe 2005 in the direction of the arrows.

In an embodiment of the present invention, the inlet check valve 2200 may be in a normally shut position at zero pressure while the outlet check valve 2800 may be in a normally open position at zero pressure. In an embodiment of the present invention, the inlet check valve 2200 may be in a normally open position at zero pressure while the outlet check valve 2800 may be in a normally shut position at zero pressure.

In an embodiment of the present invention, a series of check valves that activate at different times, such as sequentially, may be used to create a wave, or peristaltic, effect. In an embodiment of the present invention, a series of check valves that activate at different pressures may be used to create the peristaltic effect. In an embodiment of the present invention, the pressure may be selected from a range of $10^1$-$10^3$ Pascals (Pa). In an embodiment of the present invention, the pressure may be negative as well as positive.

In an embodiment of the present invention, a passive device may be connected to portions of the pipe 2005 to control or modify flow rate, flow pattern, or flow profile of the working fluid. In an embodiment of the present invention, the passive device may be located at the inlet end and the outlet end of the micropump 2000.

The passive device may include a widened portion of the pipe 2005, such as a manifold or plenum. The passive device may include a narrowed portion of the pipe 2005, such as a restrictor, aperture, or nozzle. The passive device may include a serpentine portion of the pipe 2005, such as a baffle, mixer, or diffuser.

In an embodiment of the present invention, an active device may be attached to portions of the heat transfer system 200, including the pipe 2005, the micropump 2000, and the heat exchanger 300, to control or modify various parameters, such as pressure, temperature, and flow rate. The active device may include a sensor or a probe, such as a capacitive pressure sensor, thermocouple, or flowmeter. The active device may include an actuator, such as a solenoid, relay, or motor.

In an embodiment of the present invention, the passive device or active device may include a microelectromechanical system (MEMS). In an embodiment of the present invention, the passive device or active device may include a micro-optoelectromechanical systems (MOEMS). In an embodiment of the present invention, the passive device or active device may include a nanoelectromechanical system (NEMS).

The micropump 2000 may include a chamber or cavity. In an embodiment of the present invention, the cavity may include a shape with two orthogonal planes of symmetry, such as a flattened bellow. In an embodiment of the present invention, the cavity may include a shape with three orthogonal planes of symmetry, such as an elongated balloon.

In an embodiment of the present invention, the micropump 2000 may be seal-less such that the working fluid does not contact seals in the cavity. In an embodiment of the present invention, the micropump 2000 may be bearing-less such that the working fluid does not contact bearings in the cavity.

In an embodiment of the present invention, the micropump 2000 may include two or more cavities connected in parallel. In an embodiment of the present invention, the micropump 2000 may include two or more cavities connected in series. Some of the cavities in the micropump 2000 may differ in size and shape.

The cavity in the micropump 2000 may include flexible sidewalls. The flexibility of the sidewalls may be quantified by a Young's modulus of elasticity. Young's modulus of elasticity for a material may be defined as a slope (ratio) of the linear portion of a stress-strain curve when the material is placed under tension or compression. In an embodiment of the present invention, the Young's modulus of elasticity may be selected from a range of $10^0$-$10^2$ Pa.

The sidewalls of the cavity may include a diaphragm or membrane. The membrane may be formed from a material that is reversibly deformable or elastic, such as an elastomer.

The interior of the cavity, including the membrane, may be formed from a material that is physically and chemically resistant to the working fluid at an operating temperature and pressure.

In an embodiment of the present invention, the membrane may include a homogeneous material. In an embodiment of the present invention, the membrane may include a bonded or laminated structure of two or more materials, each of which may selected to provide a different-material property, chemical property, physical property, or mechanical property. In an embodiment of the present invention, the membrane may be attached to a rib cage-like structure for support.

In an embodiment of the present invention, the elastomer may include a thermoset. In an embodiment of the present invention, the elastomer may include a thermoplastic. In an embodiment of the present invention, the elastomer may include copolymers.

In an embodiment of the present invention, the elastomer may include an organic polymer. In an embodiment of the present invention, the elastomer may include a polyurethane. In an embodiment of the present invention, the elastomer may include a polyurea. In an embodiment of the present invention, the elastomer may include a poly(urethane-co-urea). In an embodiment of the present invention, the elastomer may include a polychloroprene. In an embodiment of the present invention, the elastomer may include a fluoropolymer.

In an embodiment of the present invention, the elastomer may include an inorganic polymer. In an embodiment of the present invention, the elastomer may include a polysiloxane (commonly, but erroneously, referred to as a silicone). In an embodiment of the present invention, the elastomer may include a fluorosilicone.

In an embodiment of the present invention, the membrane may include a uniform thickness selected to provide a certain elasticity as a function of pressure, such as of the working fluid.

In an embodiment of the present invention, the thickness of the membrane may be selected from a range of 8-24 microns (um). In an embodiment of the present invention, the thickness of the membrane may be selected from a range of 24-60 um. In an embodiment of the present invention, the thickness of the membrane may be selected from a range of 60-120 um. In an embodiment of the present invention, the thickness of the membrane may be selected from a range of 120-180 um.

In an embodiment of the present invention, the membrane may include a variable thickness, such as along its length and width, selected to provide a certain shape when expanded.

In an embodiment of the present invention, the membrane may include a variable thickness, such as along its periphery, selected to provide a certain size when expanded.

In an embodiment of the present invention, the membrane may include a variable elasticity, such as along its length and width, selected to provide a certain shape when expanded.

In an embodiment of the present invention, the flexible sidewalls of the micropump 2000 may be relaxed inwards or contracted to enclose a smaller volume 2320 of working fluid. In an embodiment of the present invention, the flexible sidewalls may be deflected outwards or expanded to enclose a larger volume 2340 of working fluid.

In an embodiment of the present invention, the deflection of the flexible sidewalls may result in a total travel distance that may be selected from a range of 4-12 um. In an embodiment of the present invention, the deflection of the flexible sidewalls may result in a total travel distance that may be selected from a range of 12-30 um. In an embodiment of the present invention, the deflection of the flexible sidewalls may result in a total travel distance that may be selected from a range of 30-60 um. In an embodiment of the present invention, the deflection of the flexible sidewalls may result in a total travel distance that may be selected from a range of 60-90 um.

Certain characteristics of an elastomer should be considered when the flexible sidewalls of the cavity are formed from an elastomer. An elastomer may be nearly incompressible (no change in volume) so it would tend to deflect when compressed. A perfectly incompressible material would have a Poisson's ratio of 0.5.

Under certain conditions, an elastomer may exhibit some plastic deformation. For example, an elastomer may soften with repeated loadings. This may limit the number of deflections of the sidewalls (cycles).

An elastomer may soften more significantly with larger strains than with smaller strains. This may limit the amount of deflection of the sidewalls (total travel distance).

Young's modulus of elasticity may be difficult to determine for an elastomer since the stress-strain curve for an elastomer tends to be become significantly non-linear when the strain exceeds about 15%. This may limit the amount of deflection of the sidewalls (total travel distance).

An elastomer has a peculiar property in which Young's modulus may be larger (behaving as if stiffer) when measured dynamically (such as when vibrated or impacted) rather than statically. This may limit the rate of deflection of the sidewalls (frequency).

As shown in an embodiment of the present invention in FIG. 1, the volume (or capacity) of working fluid enclosed in the cavity may be changed by adjusting a magnetic field that permeates the sidewalls of the cavity from the outside to attract the enclosed working fluid, such as the liquid metal alloy 2010.

The magnetic field may be applied by one or more electromagnets 2400 that may be positioned around the outside of the cavity. The magnetic field may be applied by pairs of electromagnets 2400 that face each other across the cavity. In an embodiment of the present invention, an array of microelectromechanical systems (MEMS), such as micro-actuators, may provide the magnetic field.

The electromagnets 2400 may include multi-level electrically conductive windings, such as copper coils, arranged around a magnetic core, such as an electroplated NiFe or Permalloy pole.

The electromagnets 2400 may be selected to provide the desired gap, magnetic force, and frequency. The gap may depend on the total travel distance of the flexible sidewalls of the micropump 2000 when deflected. In an embodiment of the present invention, the magnetic force may be selected from a range of $10^{-2}$-$10^{1}$ milliNewtons (mN).

The magnetic field may be generated as a function of time, voltage, or current. In an embodiment of the present invention, the voltage may be selected from a range of $10^{-3}$-$10^{0}$ volts (V). In an embodiment of the present invention, the current may be selected from a range of $10^{-1}$-$10^{2}$ milliAmperes (mA). The magnetic field may be fluctuated, pulsed, or oscillated with a square wave, a sawtooth wave, or a sine wave. The magnetic field may be modulated by hardware predominantly, by software predominantly, or by a combination of hardware and software.

In an embodiment of the present invention, the electromagnets 2400 may be operated individually, in laterally-opposed pairs, or in clusters. In an embodiment of the present invention, the operation of the electromagnets 2400 may be multiplexed or networked.

The magnetic field may be altered by adjusting an input power, such as an input current. The electromagnets 2400 may be turned on and off synchronously or asynchronously. The electromagnets 2400 may be turned on and off in tandem or sequentially to create a peristaltic pumping effect.

In an embodiment of the present invention, the magnetic field may be turned on and off with a frequency selected from a range of 6-30 deflections or strokes per second or Hertz (Hz). In an embodiment of the present invention, the magnetic field may be turned on and off with a frequency selected from a range of 30-120 Hz. In an embodiment of the present invention, the magnetic field may be turned on and off with a frequency selected from a range of 120-360 Hz. In an embodiment of the present invention, the magnetic field may be turned on and off with a frequency selected from a range of 360-720 Hz.

Depending on the remanent value in the hysteresis curve, the magnetic field may have a no-zero magnitude at zero power (when the electromagnets 2400 are turned off). Furthermore, eddy current losses and hysteresis losses that may be associated with a time-variant input current (such as an Alternating Current or AC) may be compensated by proper selection of a material for the core of the electromagnets 2400. Regardless of whether the input current is AC or direct current (DC), resistive losses in the windings of the electromagnets 2400 may produce heat which may have to be properly dissipated.

The electromagnets 2400 may be partially covered or surrounded by a shield or shroud 2700 to block electromagnetic interference (EMI).

In an embodiment of the present invention, the expanded sidewalls 2340 may result in a maximum enclosed volume when the magnetic field is on. In an embodiment of the present invention, the contracted sidewalls 2320 may result in a minimum enclosed volume when the magnetic field is off. In an embodiment of the present invention, the difference between the maximum enclosed volume and the minimum enclosed volume of the working fluid may be $10^{-9}$ liter or less.

In an embodiment of the present invention, two or more micropumps 2000 may be arranged in parallel to increase the volume pumped per cycle. In an embodiment of the present invention, two or more micropumps 2000 may be arranged in series and synchronized to minimize a pressure drop in the pipe 2005, especially when the cross-section of the pipe 2005 is very small.

The inlet check valve 2200 and the outlet check valve 2800 only permit a flow forwards, and not a flow backwards, when the (incompressible) working fluid is squeezed by changing from the expanded sidewalls 2340 to the contracted sidewalls 2320 during operation of the micropump 2000.

In an embodiment of the present invention, the electromagnets 2400 may be magnetically coupled to a collar 2600. In an embodiment of the present invention, the collar 2600 may distribute the magnetic field more uniformly. In an embodiment of the present invention, the collar 2600 may form a mold or support for the membrane to limit or restrict the expanded sidewalls 2340 to a certain shape and size.

The heat in the working fluid recirculated through the pipe 2005 by the micropump 2000 may be transferred across a second thermal interface material (TIM2) 305 to a remote heat rejection system, such as a heat sink, heat spreader, or heat exchanger 300. In an embodiment of the resent invention, the heat transfer may be passive with conduction as a primary mechanism. In an embodiment of the resent invention, the heat transfer may be active with forced convection (not shown) as a primary mechanism.

As shown in an embodiment of the present invention in FIG. 1, the portion of the pipe 2005 that contacts the TIM2 305 may be located at an outer surface of the heat exchanger 300. In an embodiment of the present invention, the portion of the pipe 2005 that contacts the TIM2 305 may be located in a recessed region (not shown) adjacent to the outer surface of the heat exchanger 300. In an embodiment of the present invention, the portion of the pipe 2005 that contacts the TIM2 305 may be located in an embedded region (not shown) of the heat exchanger 300.

As shown in an embodiment of the present invention in FIG. 1, the portion of the pipe 2005 that contacts the TIM2 305 may include surface channels having various dimensions, cross-sections, and shapes. In an embodiment of the present invention, the portion of the pipe 2005 that contacts the TIM3 305 may include sub-surface channels (not shown) having various dimensions, cross-sections, and shapes.

In an embodiment of the present invention, the heat exchanger 300 may include an ambient heat exchanger with a series of plates or fins (not shown). The fins increase the surface area for heat transfer for a given quantity of working fluid. Heat may be dissipated from the fins to the environment by a fan (not shown) using a forced convection mechanism.

In an embodiment of the present invention, the heat exchanger may include a thermoelectric cooler (TEC). The TEC is a solid-state device formed from semiconductor materials. At room temperature, the TEC may be formed from bulk semiconductor materials, such as n-doped and p-doped Bismuth-Telluride, including $Bi_2Te_3$ alloys.

The operation of the TEC is based on the Peltier effect. When direct current (DC) flows from the n-doped material to the p-doped material, heat is absorbed. When DC flows from the p-doped material to the n-doped material, heat is dissipated. By forming a device where DC flows from n-doped to p-doped on one side and from p-doped to n-doped on the other side, one side of the device will absorb heat (decrease in temperature to become colder) while the other side of the device will dissipate heat (increase in temperature to become hotter). If the direction of the DC is reversed, the cold side and the hot side will change sides.

The size of the TEC may be reduced from millimeter-scale to micron-scale by using thin film (TF) to form a more integrated, and thus compact, device. In an embodiment of the present invention, a monolithic TF-TEC may be formed from p-type $Bi_2Te_3/Sb_2Te_3$ superlattice devices with a high figure of merit, ZT, such as about 2.4.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described an apparatus for and a method of transferring heat from a heat source, such as a chip with a hot spot, to a remote heat rejection system.

We claim:

1. A method comprising:
    confining a liquid metal alloy within a closed-loop system;
    distributing a first portion of said liquid metal alloy in a cavity within said closed-loop system;
    turning on an electromagnet to generate a magnetic field to permeate flexible sidewalls of said cavity;
    attracting said liquid metal alloy in said cavity towards said electromagnet to expand said flexible sidewalls;
    inducing a second portion of said liquid metal alloy to enter said cavity from an inlet end of a pipe within said closed-loop system;
    turning off said electromagnet;
    repelling said liquid metal alloy in said cavity away from said electromagnet to contract said flexible sidewalls; and
    inducing a third portion of said liquid metal alloy to exit said cavity to an outlet end of said pipe.

2. The method of claim 1 wherein said liquid metal alloy is ferromagnetic.

3. The method of claim 1 wherein said liquid metal alloy is paramagnetic.

4. The method of claim 1 wherein said flexible sidewalls comprise an elastomer, said elastomer being physically and chemically resistant to said liquid metal alloy at an operating temperature and pressure.

5. The method of claim 1 further comprising: transferring heat from a chip to said liquid metal alloy.

6. The method of claim 1 further comprising: transferring heat from said liquid metal alloy to a heat exchanger.

* * * * *